United States Patent
Samuel et al.

(10) Patent No.: US 10,597,998 B2
(45) Date of Patent: Mar. 24, 2020

(54) ADJUSTING SURVEY POINTS POST-CASING FOR IMPROVED WEAR ESTIMATION

(71) Applicant: LANDMARK GRAPHICS CORPORATION, Houston, TX (US)

(72) Inventors: Robello Samuel, Cypress, TX (US); Aniket, Houston, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 274 days.

(21) Appl. No.: 15/328,414

(22) PCT Filed: Sep. 8, 2014

(86) PCT No.: PCT/US2014/054594
§ 371 (c)(1),
(2) Date: Jan. 23, 2017

(87) PCT Pub. No.: WO2016/039723
PCT Pub. Date: Mar. 17, 2016

(65) Prior Publication Data
US 2017/0204720 A1    Jul. 20, 2017

(51) Int. Cl.
*E21B 47/00* (2012.01)
*E21B 47/022* (2012.01)
(Continued)

(52) U.S. Cl.
CPC .......... *E21B 47/0006* (2013.01); *E21B 7/046* (2013.01); *E21B 12/02* (2013.01);
(Continued)

(58) Field of Classification Search
CPC . E21B 7/04; E21B 7/024; E21B 47/00; E21B 44/00; E21B 47/0006; E21B 33/14; E21B 12/02
(Continued)

(56) References Cited

U.S. PATENT DOCUMENTS 3,343,890 A    9/1967  Homer
3,682,256 A    8/1972  Stuart
(Continued)

FOREIGN PATENT DOCUMENTS

CN    202166578        3/2011
WO    1997013951 A1    4/1997
(Continued)

OTHER PUBLICATIONS

CA Application Serial No. 2,956,570, Office Action, dated Oct. 12, 2018, 4 pages.
(Continued)

*Primary Examiner* — John E Breene
*Assistant Examiner* — Jeffrey P Aiello
(74) *Attorney, Agent, or Firm* — Gilliam IP PLLC

(57) ABSTRACT

Disclosed embodiments include a method for estimating casing wear including the operations of: obtaining locations of survey points along a borehole, said survey point locations representing a borehole trajectory; casing at least a portion of the borehole with a casing string; deriving locations of adjusted survey points that represent a casing trajectory along said portion of the borehole, the casing trajectory being different from the borehole trajectory; estimating, as a function of position along said casing string, a side force of a drill string against the casing string; computing, as a function of position along the casing string, casing wear based at least in part on the side force; and generating a notification of any positions where casing wear exceeds a threshold.

22 Claims, 2 Drawing Sheets

(51) Int. Cl.
    G06F 17/50    (2006.01)
    E21B 44/00    (2006.01)
    E21B 47/12    (2012.01)
    E21B 7/04     (2006.01)
    E21B 12/02    (2006.01)
    E21B 47/08    (2012.01)
    E21B 33/14    (2006.01)
    E21B 47/18    (2012.01)

(52) U.S. Cl.
    CPC ........ *E21B 44/00* (2013.01); *E21B 47/02216* (2013.01); *E21B 47/08* (2013.01); *E21B 47/12* (2013.01); *G06F 17/5018* (2013.01); *E21B 7/04* (2013.01); *E21B 33/14* (2013.01); *E21B 47/18* (2013.01)

(58) Field of Classification Search
    USPC .......... 73/152.02; 175/45; 324/240; 702/7, 9
    See application file for complete search history.

(56) References Cited

U.S. PATENT DOCUMENTS

| | | | | |
|---|---|---|---|---|
| 4,744,030 | A * | 5/1988 | Carlson | G01V 3/28 181/105 |
| 5,044,198 | A * | 9/1991 | Ho | E21B 7/04 175/39 |
| 5,603,386 | A * | 2/1997 | Webster | E21B 7/062 175/325.3 |
| 5,857,531 | A | 1/1999 | Estep et al. | |
| 9,605,526 | B2 | 3/2017 | Samuel et al. | |
| 2002/0144545 | A1 | 10/2002 | Cesmat et al. | |
| 2003/0042897 | A1 * | 3/2003 | Wolodko | E21B 47/0008 324/240 |
| 2004/0206509 | A1 | 10/2004 | Slack | |
| 2004/0239316 | A1 | 12/2004 | Yoo | |
| 2005/0071120 | A1 | 3/2005 | Hutchinson | |
| 2005/0267686 | A1 | 12/2005 | Ward | |
| 2010/0207620 | A1 * | 8/2010 | Gies | G01N 27/9033 324/240 |
| 2010/0307742 | A1 * | 12/2010 | Phillips | E21B 47/022 166/250.01 |
| 2012/0080184 | A1 | 4/2012 | Jahangir et al. | |
| 2015/0176401 | A1 | 6/2015 | Samuel et al. | |
| 2016/0070024 | A1 * | 3/2016 | Berard | G01V 99/005 703/10 |
| 2016/0119591 | A1 | 4/2016 | Samuel | |
| 2016/0230528 | A1 | 8/2016 | Samuel et al. | |
| 2016/0290123 | A1 | 10/2016 | Samuel | |
| 2016/0326844 | A1 | 11/2016 | Samuel et al. | |
| 2017/0022798 | A1 | 1/2017 | Samuel et al. | |
| 2018/0023385 | A1 * | 1/2018 | Bang | G01V 1/40 175/45 |

FOREIGN PATENT DOCUMENTS

| | | |
|---|---|---|
| WO | 2002083264 A1 | 10/2002 |
| WO | 2012037248 A2 | 3/2012 |

OTHER PUBLICATIONS

PCT Application Serial No. PCT/US2014/054594, Application as Filed: Adjusting Survey Points Post-Casing for Improved Wear Estimation, Filed Sep. 8, 2014, 15 pages.

PCT International Search Report and Written Opinion, dated Jun. 4, 2015, Appl No. PCT/US2014/050582, "Directional Tendency Predictors for Rotary Steerable Systems," filed Aug. 11, 2014, 10 pgs.

McSpadden, A., et al., "Development of a Stiff-String Forces Model for Coiled Tubing," SPE-74831-MS, prepared for Presentation at the SPE/ICoTA Coiled Tubing Conference and Exhibition held in Houston, Texas, U.S., Apr. 9-10, 2002.

Gorokhova, L., et. al., "Comparing Soft-String and Stiff-String Methods used to Compute Casing Centralization," SPE-163424-PA, accepted for presentation at the SPE/IADC Drilling Conference and Exhibition, Amsterdam, Mar. 5-7, 2013.

AU Application Serial No. 2014389447, First Examination Report, dated Jul. 12, 2017, 8 pages.

AU Application Serial No. 2014389447, Second Examination Report, dated Oct. 30, 2017, 4 pages.

CA Application Serial No. 2943052, Office Action, dated Sep. 19, 2017, 6 pages.

Nagy, "Casing Wear Evaluation Through Simulation", SPE International Conference, Visegrad, presented Nov. 21, 2013, [retrieved from Internet Jun. 14, 2017] http://connect.spe.orgHigherLogicSystemDownloadDocumentFile.ashx?DocumentFileKey=02de3cd3-8384-4ba6-9b83-fd9be93a3743, 25 pages.

Tikhonov, et al., "Dynamic Model for Stiff String Torque and Drag", SPE/IADC Drilling Conference and Exhibition, Amsterdam, presented Mar. 5-7, 2013, [retrieved from internet Jun. 14, 2017] http://www.onepetro.org/conference-paper/SPE-163566-MS, 16 pages.

PCT Application Serial No. PCT/US2014/050702, International Search Report & Written Opinion, dated Jan. 8, 2015, 12 pages.

PCT Application Serial No. PCT/US2014/050702, International Preliminary Report on Patentability, dated May 31, 2016, 8 pages.

Deli, Gao et al., "Prediction of Casing Wear in Extended Reach Drilling", Pet. Sci. 2010, pp. 494-501.

Hall Jr., R.W. et al., "Recent Advances in Casing Wear Technology", presented at IADC/SPE Drilling Conference, Feb. 14-18, 1994, 8 pages.

Hall Jr., R.W. et al., "Contact Pressure Threshold: An Important New Aspect of Casing Wear", SPE 94300, presented at the SPE Production & Operations Symposium, Apr. 17-19, 2005, 7 pages.

Aniket, et al., "Analytical Model to Estimate the Downhole Casing Wear Using the Total Wellbore Energy", Journal of Energy Resources Technology—ASME, vol. 135, Dec. 2013, 8 pages.

* cited by examiner

ADJUSTING SURVEY POINTS POST-CASING FOR IMPROVED WEAR ESTIMATION

BACKGROUND

To produce hydrocarbons from subterranean reservoirs, oilfield operators drill and at least partially case boreholes. For example, a shallow portion of the borehole may be promptly cased to protect the water table from possible contamination by hydrocarbons and drilling fluids, whereas deeper portions of the borehole may be later cased as needed to facilitate the drilling process or completion of the well.

Each borehole is typically cased with a steel casing string, i.e., continuous or threaded lengths of steel pipe lowered into the borehole before being cemented in place. Despite being made of steel and secured by cement, casing strings can fail. Among the many factors that may contribute to casing failure is internal casing wear. The main cause of such casing wear is the frictional rubbing of other tubular strings on the inner surface of the casing string. For example, as a drill string moves and rotates inside a casing string, it rubs against the inner surface of the casing string (often with extreme force), potentially reducing the wall thickness and thereby degrading the casing string's integrity and resistance to deformation.

Where such wear is accurately identified or predicted, corrective action can be taken to restore or preserve casing string integrity, e.g., by providing a liner and/or altering a drilling program to mitigate wear damage. Such corrective actions can avoid non-productive time and other forms of economic and/or environmental losses that can be caused by loss of casing integrity. Nevertheless, the accuracy of existing models for identifying and predicting casing wear appears, for many deviated well configurations, to be inadequate.

BRIEF DESCRIPTION OF THE DRAWINGS

Accordingly, there are disclosed herein systems and methods that estimate casing string wear volume in a manner that accounts for the variance between the paths of the borehole and the casing string. In the drawings.

Figure 1A:
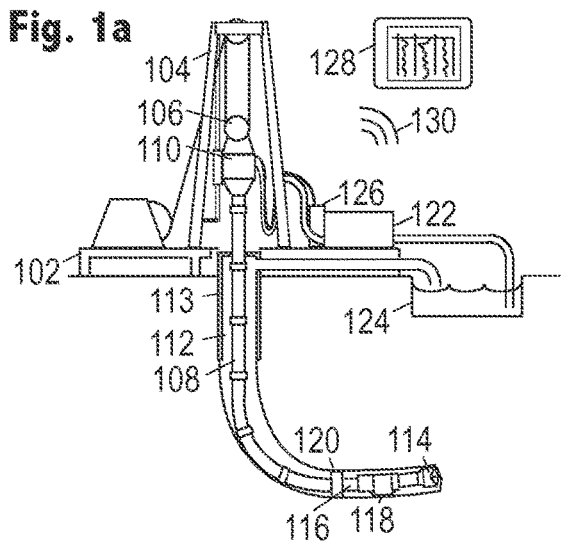
FIG. 1a is a schematic diagram of an illustrative well drilling environment.

It should be understood, however, that the specific embodiments given in the drawings and detailed description thereto do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

To provide context and facilitate understanding of the present disclosure, FIG. 1a shows an illustrative drilling environment, in which a drilling platform 102 supports a derrick 104 having a traveling block 106 for raising and lowering a drill string 108. A top-drive motor 110 supports and turns the drill string 108 as it is lowered into the borehole 112. The drill string's rotation, alone or in combination with the operation of a downhole motor, drives the drill bit 114 to extend the borehole. The drill bit 114 is one component of a bottomhole assembly (BHA) 116 that may further include a rotary steering system (RSS) 118 and stabilizer 120 (or some other form of steering assembly) along with drill collars and logging instruments. A pump 122 circulates drilling fluid through a feed pipe to the top drive 110, downhole through the interior of drill string 108, through orifices in the drill bit 114, back to the surface via the annulus around the drill string 108, and into a retention pit 124. The drilling fluid transports cuttings from the borehole 112 into the retention pit 124 and aids in maintaining the integrity of the borehole. An upper portion of the borehole 112 is stabilized with a casing string 113 and the lower portion being drilled is open (uncased) borehole.

The drill collars in the BHA 116 are typically thick-walled steel pipe sections that provide weight and rigidity for the drilling process. The thick walls are also convenient sites for installing logging instruments that measure downhole conditions, various drilling parameters, and characteristics of the formations penetrated by the borehole. The BHA 116 typically further includes a navigation tool having instruments for measuring tool orientation (e.g., multi-component magnetometers and accelerometers) and a control sub with a telemetry transmitter and receiver. The control sub coordinates the operation of the various logging instruments, steering mechanisms, and drilling motors, in accordance with commands received from the surface, and provides a stream of telemetry data to the surface as needed to communicate relevant measurements and status information. A corresponding telemetry receiver and transmitter is located on or near the drilling platform 102 to complete the telemetry link. The most popular telemetry link is based on modulating the flow of drilling fluid to create pressure pulses that propagate along the drill string ("mud-pulse telemetry or MPT"), but other known telemetry techniques are suitable. Much of the data obtained by the control sub may be stored in memory for later retrieval, e.g., when the BHA 116 physically returns to the surface.

A surface interface 126 serves as a hub for communicating via the telemetry link and for communicating with the various sensors and control mechanisms on the platform 102. A data processing unit (shown in FIG. 1a as a tablet computer 128) communicates with the surface interface 126 via a wired or wireless link 130, collecting and processing measurement data to generate logs and other visual representations of the acquired data and the derived models to facilitate analysis by a user. The data processing unit may take many suitable forms, including one or more of: an embedded processor, a desktop computer, a laptop computer, a central processing facility, and a virtual computer in the cloud. In each case, software on a non-transitory information storage medium may configure the processing unit to carry out the desired processing, modeling, and display generation.

Among the various types of measurement data that may be acquired by the BHA 116 are multi-component measurements of the earth's magnetic field and gravitational field at each of a series of survey points (or "stations") along the length of the borehole. The survey points are typically those positions where the navigation tool is at rest, e.g., where drilling has been halted to add lengths of drill pipe to the drill string. The gravitational and magnetic field measurements reveal the slope ("inclination") and compass direction ("azimuth") of the borehole at each survey point. When combined with the length of the borehole between survey points (as measureable from the length added to the drill string), these measurements enable the location of each survey point to be determined using known techniques such as, e.g., the tangential method, the balanced tangential method, the equal angle method, the cylindrical radius of curvature method, or the minimum radius of curvature method, to model intermediate trajectories between survey points. When combined together, these intermediate trajectories form an overall borehole trajectory.

Also among the various types of measurement data that may be acquired by the BHA 116 are caliper measurements, i.e., measurements of the borehole's diameter, optionally including the borehole's cross-sectional shape and orientation, as a function of position along the borehole. Further included may be weight on bit (WOB), downhole torque, downhole rotational speed (RPM), and vibration. As explained below, such measurements may be expected to correlate well with casing wear. Related measurements may also be acquired with surface sensors on the rig 104 and may also or alternatively be employed for estimating casing wear.

Figure 1B:
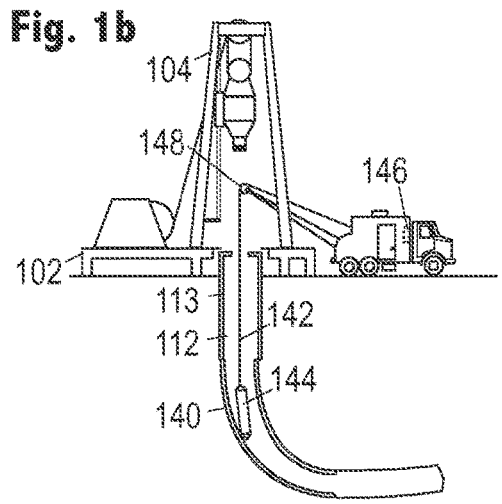
FIG. 1b is a schematic diagram of an illustrative wireline logging environment.

FIG. 1*b* shows the environment of rig 104 during a wireline operation being conducted after a second casing string 140 has been deployed into the borehole 112. A wireline cable 142 suspends a wireline logging tool 144 in the borehole and couples the tool to a processing unit 146. A pulley 148 (shown as affixed to wireline truck boom, but alternatively affixed to the rig 104) enables the wireline truck winch to convey the wireline logging tool 144 along the borehole at a controlled speed. The wireline cable includes electrical and/or optical conductors for transporting measurement data to the processing unit 146 and optionally conveying electrical power to the tool 144. In some embodiments, the logging tool 144 may have pads and/or centralizing members to maintain the tool near the axis of the borehole as the tool is pulled uphole. The wireline logging tool 144 may acquire magnetic and gravitational field measurements as a function of position, caliper measurements (which may be indicative of casing wear and deformation), cement bond logs, and formation property measurements.

The processing unit 146 collects measurements from the logging tool 144, storing and processing the measurements. Software stored on a nontransitory information storage medium may configure the processing unit 146 to carry out the desired data acquisition, storage, and processing, alone or in cooperation with a central processing facility having access to the data acquired during the drilling process.

Figure 2:
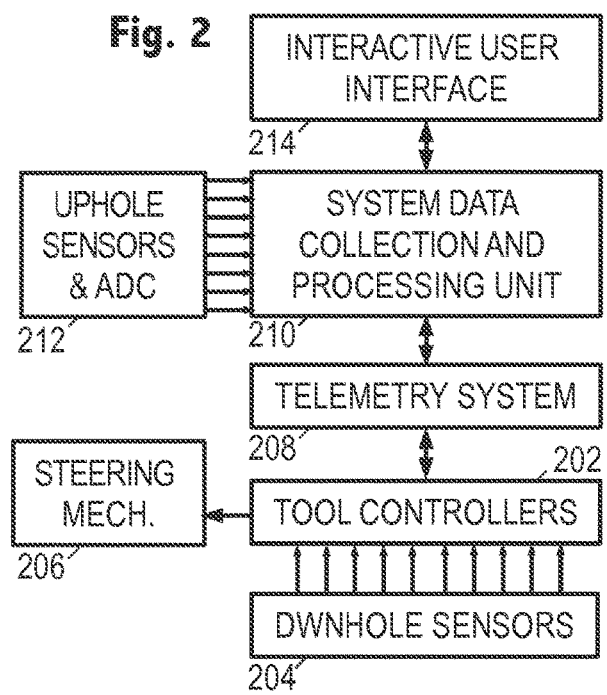
FIG. 2 is a function-block diagram of a logging while drilling (LWD) system.

FIG. 2 is a function-block diagram of an illustrative directional drilling system, though the illustrated modules are also largely representative of a wireline logging system. One or more downhole tool controllers 202 collect measurements from a set of downhole sensors 204, preferably but not necessarily including navigational sensors, drilling parameter sensors, and formation parameter sensors, to be digitized and stored, with optional downhole processing to compress the data, improve the signal to noise ratio, and/or to derive parameters of interest from the measurements.

A telemetry system 208 conveys at least some of the measurements or derived parameters to a processing system 210 at the surface, the uphole system 210 collecting, recording, and processing measurements from sensors 212 on and around the rig in addition to the telemetry information from downhole. Processing system 210 generates a display on interactive user interface 214 of the relevant information, e.g., measurement logs, borehole trajectory, casing trajectory, or extracted values such as casing wear and recommended drilling parameters to preserve integrity of existing casing or to optimize a trajectory for proposed casing to limit estimated casing wear. The processing system 210 may further accept user inputs and commands and operate in response to such inputs to, e.g., transmit commands and configuration information via telemetry system 208 to the tool controllers 202. Such commands may alter the settings of the steering mechanism 206.

Figure 3:
FIG. 3 is a cross-section of a borehole with casing.

The software that executes on processing units 128, 146, and/or 210, includes a casing wear estimation program with a casing trajectory determination module. As illustrated by FIG. 3, the difference between the diameter of borehole 302 and the outer diameter of the casing string 304 enables the casing string to follow a slightly different trajectory than that of the borehole, particularly in regions of high tortuosity where the trajectory of a relatively stiff casing string can "cut the corners" and thereby attain curvature radii that are larger than those of the borehole trajectory. Conversely, it is possible for casing strings of relatively low stiffness to flex into sinusoidal or helical curves even in relatively straight portions of the borehole, thereby exhibiting smaller radii of curvature than the corresponding portion of the borehole. The casing trajectory determination module accounts for the casing string stiffness and the dimensional difference between casing and borehole diameters to determine a casing string trajectory that is then used as a basis for estimating casing wear.

At least some embodiments of the casing trajectory determination module employ the nominal outer diameter of the casing string and the nominal borehole diameter, together with stiffness of the casing string and the borehole trajectory as represented by the survey station locations, to determine the casing trajectory. The casing trajectory determination module may further employ an open-hole caliper log representing a measured diameter and/or shape of the borehole as a function of position. Alternatively, or in addition, the casing trajectory determination module may account for the location and size of the threaded couplings between casing joints and the location and size of any casing centralizers. The casing trajectory determination module may still further account for forces on the casing string during the cementing process including gravity, buoyancy, and compression. Some casing trajectory determination module implementations may employ a stiff-string model or a finite-element model to derive the casing trajectory from some combination of the foregoing parameters. Details on the use of stiff-string models may be found in references such as A. McSpadden and K. Newman, "Development of a Stiff-String Forces Model for Coiled Tubing," SPE-74831-MS (2002), and L. Gorokhova, A. Parry, and N. Flamant, "Comparing Soft-String and Stiff-String Methods used to Compute Casing Centralization," SPE-163424-PA (2014).

In addition to the casing trajectory determination module, the software includes side force determination module that determines the side force exerted by a drill string on the casing string. The side force determination module may employ a soft-string model for this purpose or, to more completely account for the bending stiffness and various forces operating on a drill string inside the casing string, may derive the drill string trajectory using a stiff-string model or a finite element model. The rotation of the drill string may cause these forces to include viscous drag and torque in addition to gravity, buoyancy, compression, and vibration. The side force determination module may determine the contact points and the side forces exerted by the drill string at those points. Some allowance may be made for intermittent contact in regions of low clearance.

The software that executes on processing units 128, 146, and/or 210 further includes a casing wear estimation module that operates on the side force to determine an estimate of casing wear as a function of position along the casing. The casing wear may be expressed in various forms, e.g., as an eroded volume, a groove depth, a casing wall thickness, a safety margin, and a probability of integrity failure. To estimate casing wear, the module may combine the side force with other parameters including a wear factor, a rotation rate, and a measure of the drilling time. The rotation rate and drilling time may be measured by sensors at the surface. The wear factor may be based solely on the materials of the casing and drill strings, or may be derived from other sensor measurements such as, e.g., torque and viscous drag. The software may display to a user a graphical representation of the casing wear, e.g., in the form of a log.

Figure 4:
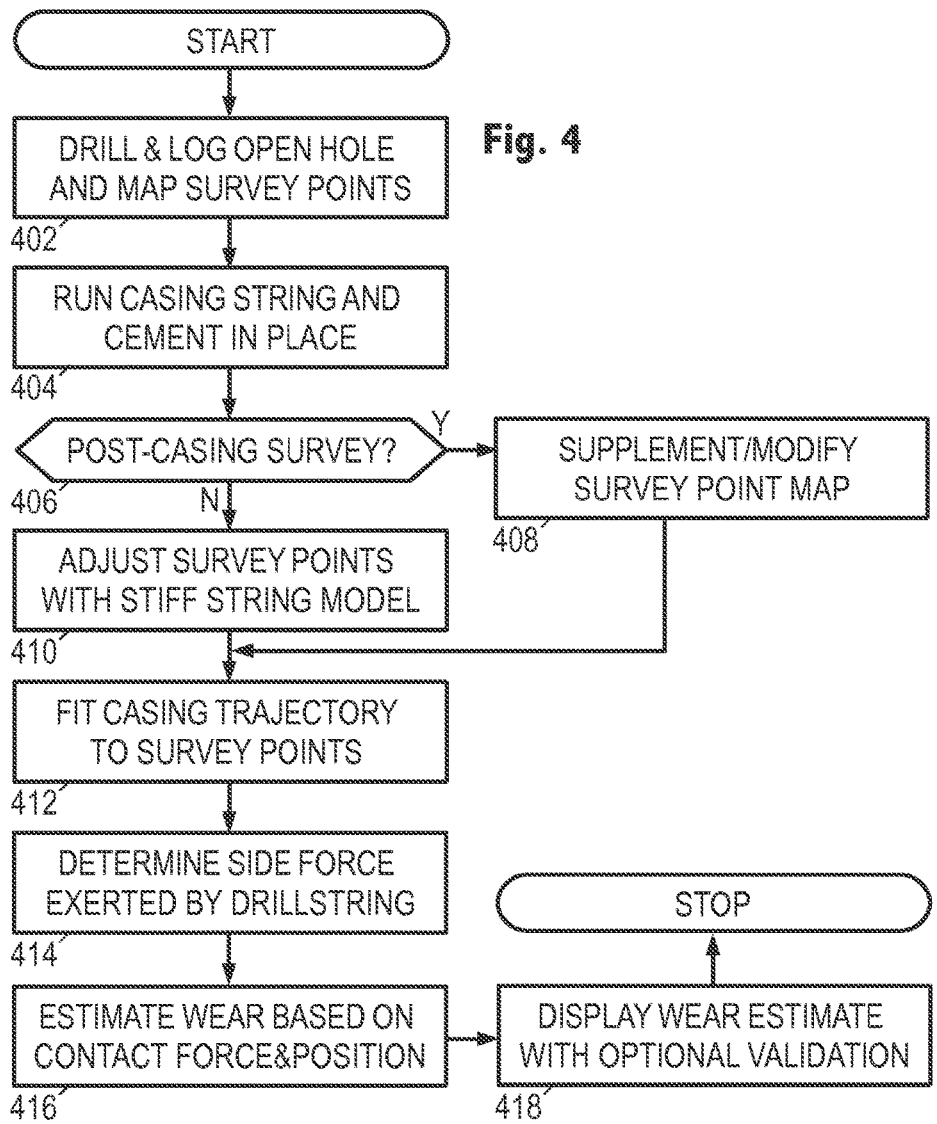
FIG. 4 is a flow diagram of an illustrative casing wear estimation method.

FIG. 4 is a flow diagram of an illustrative casing wear estimation method. The method may be implemented at least in part by software stored in a non-transitory information storage medium to be executed by processing units 128, 146, and/or 210. Beginning at block 402, the software obtains survey station information representing a trajectory of the open borehole, preferably as the borehole is drilled. Nevertheless, the survey may be performed post-drilling and, if desired, performed using a wireline logging tool in the open borehole.

In block 404, a casing string is run into the borehole and preferably cemented in place. As explained previously, there may be a variance between the trajectory of the open borehole and the cemented casing string. In block 406, the system determines whether there is any post-casing logging information that be employed to discern the differences between the trajectories of the borehole and casing string. One example of such logging information is a post-casing survey that maps the slope and compass direction at regularly spaced survey points along the casing string. Another example of such logging information would be circumferential measurements of cemented annular thickness. If such logging information exists, the software may employ the measurements in block 408 to adjust the locations of the pre-casing survey stations and to supplement them with locations of intermediate survey stations. In the absence of such information, the software may in block 410 employ a stiff-string or finite element model to estimate how the casing string stiffness (and any other considered factors) cause the casing string trajectory to deviate from the borehole survey points, and may further adjust the locations of the borehole survey points accordingly to better reflect the corresponding survey points along the casing string.

The output of blocks 408 or 410 is the location information of survey stations along the casing string. In block 412, the software fits a casing string trajectory to the adjusted survey points, optionally employing a stiff-string model or a finite element model to do so. Using this casing trajectory, the software then in block 414 determines the side force exerted by a drill string within the casing string, optionally using a soft-string model. Where it is desired to account for the bending stiffness and other forces affecting the drill string trajectory, the software may instead employ a stiff-string or finite element model in block 414. In block 416, the software uses the side force ("contact force") as a function of position together with other factors to estimate casing wear as a function of position. Examples of such other factors may include drilling time, rotation rate, a wear coefficient, and properties of the drill string (such as tool joint length, tool joint outer diameter, tool joint spacing, surface texture).

In block 418, the software displays the estimated casing wear, e.g., in the form of a log. Optionally, the software may further display validation information. One illustrative form of validation information may be a caliper log collected by a wireline tool to measure the casing wear after drilling has been completed. Any differences between the estimated wear and actual wear may be used to refine the casing wear estimation method in future wells.

In some implementations of the method, the displayed estimates of casing wear may be accompanied by recommendations for corrective or preventative actions. For example, the software may, upon detecting undesirably high levels of casing wear, recommend the use of a lubricant in the drilling fluid to reduce the wear coefficient, or recommend limits on the weight-on-bit, rotation rate and/or drilling time. Where excessive wear cannot be prevented, the software may recommend the use of a liner to insure or restore the casing integrity.

Numerous other modifications, equivalents, and alternatives, will become apparent to those skilled in the art once the above disclosure is fully appreciated. Where the term casing wear volume is used herein, other measures of casing wear may alternatively be employed, including casing wear groove depth, remaining casing wall thickness, a safety margin, or a predicted chance of casing integrity loss. It is intended that the following claims be interpreted to embrace all such modifications, equivalents, and alternatives where applicable.

As a condensed summary to support the contemplated scope of the following claims, we note here that the disclosed embodiments include at least:

A: A method for estimating casing wear including the operations of: obtaining locations of survey points along a borehole, said survey point locations representing a borehole trajectory; casing at least a portion of the borehole with a casing string; deriving locations of adjusted survey points that represent a casing trajectory along said portion of the borehole, the casing trajectory being different from the borehole trajectory; estimating, as a function of position along said casing string, a side force of a drill string against the casing string; computing, as a function of position along the casing string, casing wear based at least in part on the side force; and generating a notification of any positions where casing wear exceeds a threshold.

B. A drilling system that includes: a logging tool, a casing string, a drilling rig, and a processing unit. The logging tool obtains locations of survey points along open portions of the borehole, the locations representing a borehole trajectory. The casing string is positioned to stabilize at least a portion of the borehole after said locations have been obtained. The drilling rig drives a drill string to extend the borehole. The processing unit estimates casing wear for the casing string based at least in part on said locations. The estimating includes: deriving locations of adjusted survey points that represent a casing trajectory along the borehole based at least in part on a bending stiffness of the casing string; and computing, as a function of position along the casing string, the casing wear based at least in part on the casing trajectory and one or more of: a bending stiffness of a drill string, a rotational speed of the drill string, a drilling time, and a wear factor.

One or more of the following features, and any combination thereof, may be employed in either of embodiments A and B: 1. Deriving locations of adjusted survey points employs a model that accounts for a bending stiffness of the casing string, which model may be a stiff string model or a finite element model. 2. Deriving locations of adjusted survey points accounts for one or more casing string centralizers on the casing string. 3. Deriving locations of adjusted survey points is based at least in part on a pre-casing caliper log. 4. Deriving locations of adjusted survey points is based at least in part on a post-casing survey log. 5a. Estimating a side force using a soft-string model. 5b. Estimating a side force with a model that accounts for a bending stiffness of the drill string. 6. Computing casing wear is based on at least one of a wear factor, a rotational speed of the drill string, and a drilling time. 7. If the casing wear exceeds a threshold, a recommendation is provided, the recommendation including modifying or limiting at least one of the side force, the wear factor, the rotational speed, and the drilling time, to a value that would reduce the computed casing wear below the threshold. 8. The casing wear is computed as a casing string wear volume or a casing string wear groove depth. 9. The casing wear is computed as a casing wall thickness, a casing wall safety margin, or an estimated probability of casing integrity loss. 10. The casing wear estimation software is stored on a non-transitory information storage medium. 11. The software causes the processing unit to display the casing wear as a log.

What is claimed is:

1. A method for estimating casing wear, comprising:
    obtaining locations of survey points along an open portion of a borehole, said survey point locations representing a borehole trajectory of the borehole;
    casing at least a portion of the borehole with a casing string to form a cased portion of the borehole;
    deriving, using the survey point locations, locations of adjusted survey points along one or more portions of the cased portion of the borehole using a model that accounts for a bending stiffness of the casing string;
    fitting a casing trajectory to the locations of the adjusted survey points, the casing trajectory representing a path of the casing string along the one or more portions of the cased portion of the borehole, the path of the casing trajectory different from a path of the borehole trajectory;
    estimating, using the casing trajectory fitted to the locations of the adjusted survey points, a side force of a drill string against the casing string as a function of position along said casing string;
    computing, as a function of position along the casing string, casing wear based at least in part on the side force; and
    generating a notification of any positions where casing wear exceeds a threshold.

2. The method of claim 1, wherein said model is a stiff string model or a finite element model.

3. The method of claim 1, wherein said deriving further accounts for one or more casing string centralizers on the casing string.

4. The method of claim 1, wherein said deriving is based at least in part on a pre-casing caliper log.

5. The method of claim 1, wherein said deriving is based at least in part on a post-casing survey log.

6. The method of claim 1, wherein said estimating accounts for a bending stiffness of the drill string.

7. The method of claim 1, wherein said estimating employs a soft-string model.

8. The method of claim 1, wherein said computing is further based on at least one of a wear factor, a drill string property, a rotational speed of the drill string, and a drilling time.

9. The method of claim 8, further comprising: upon determining that the casing wear exceeds a threshold, providing a recommendation that includes modifying or limiting at least one of the side force, the wear factor, the rotational speed, and the drilling time, to a value that would reduce the computed casing wear below the threshold.

10. The method of claim 1, wherein the casing wear is computed as a casing string wear volume or a casing string wear groove depth.

11. The method of claim 1, wherein the casing wear is computed as a casing wall thickness, a casing wall safety margin, or an estimated probability of casing integrity loss.

12. A drilling system that comprises:
    a logging tool that obtains locations of survey points along open portions of a borehole, the locations representing a borehole trajectory of the borehole;
    a casing string positioned to stabilize at least a portion of the borehole after said locations have been obtained;
    a drilling rig that drives a drill string to extend the borehole; and
    a processing unit that, based at least in part on said locations of the survey points, estimates casing wear for the casing string, said estimating including:
    deriving, using the locations of the survey points, locations of adjusted survey points that represent a casing trajectory along the borehole based at least in part on a bending stiffness of the casing string;
    computing, as a function of position along the casing string, the casing wear based at least in part on the casing trajectory and one or more of: a bending stiffness of a drill string, a rotational speed of the drill string, a dimensional property of the drill string, a drilling time, and a wear factor.

13. The system of claim 12, wherein the processing unit comprises casing wear estimation software stored on a non-transitory information storage medium.

14. The system of claim 13, wherein the software causes the processing unit to display the casing wear as a log.

15. The system of claim 12, wherein the software employs at least one of a stiff string model and a finite element model to account for bending stiffness of the casing string.

16. The system of claim 15, wherein the software further employs the stiff string or finite element model to account for bending stiffness of the drill string.

17. The system of claim 12, wherein said computing includes determining a side force of the drill string against the casing string using a soft-string model.

18. The system of claim 12, wherein said computing includes determining a side force of the drill string against the casing string.

19. The system of claim 12, wherein said deriving further accounts for one or more casing string centralizers on the casing string.

20. The system of claim 12, wherein said deriving is based at least in part on a pre-casing caliper log.

21. The system of claim 12, wherein the casing wear is computed as a casing string wear volume or a casing string wear groove depth.

22. The system of claim 12, wherein the casing wear is computed as a casing wall thickness, a casing wall safety margin, or an estimated probability of casing integrity loss.

* * * * *